United States Patent
Jung et al.

(10) Patent No.: US 12,336,306 B2
(45) Date of Patent: Jun. 17, 2025

(54) SPAD STRUCTURE

(71) Applicant: DB HiTek Co., Ltd., Bucheon-si (KR)

(72) Inventors: Ju Hwan Jung, Seoul (KR); Young Hwan Hyeon, Namyangju-si (KR); Jong Man Kim, Seongnam-si (KR); Byoung Soo Choi, Suwon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 452 days.

(21) Appl. No.: 17/819,572

(22) Filed: Aug. 12, 2022

(65) Prior Publication Data

US 2023/0066769 A1 Mar. 2, 2023

(30) Foreign Application Priority Data

Aug. 31, 2021 (KR) .................. 10-2021-0115550

(51) Int. Cl.
*H10F 30/225* (2025.01)
*H10F 39/00* (2025.01)

(52) U.S. Cl.
CPC ......... *H10F 30/225* (2025.01); *H10F 39/803* (2025.01); *H10F 39/807* (2025.01)

(58) Field of Classification Search
CPC ..... H01L 31/09; H01L 31/18; H01L 31/1876; H01L 31/105; H01L 31/107; H01L 31/0232; H01L 31/02327; H01L 31/02325; H01L 31/02363; H01L 31/0296; H01L 27/144; H01L 27/146; H01L 27/14636; H01L 27/14618; H01L 27/14627; H01L 27/14625; H01L 27/14623; H01L 27/14634; H01L 27/14643; H01L 27/14607; H01L 27/1462; H01L 27/1469; H01L 27/14685; H01L 27/14687; H01L 27/14689; H01L 21/682; H01L 21/683187; H01L 21/2007; H01L 21/76251; H01L 24/32; H01L 23/3114; H01L 27/1463; H01L 27/1443; H01L 27/14603; H01L 27/1461; H01L 27/14601–14609; H01L 27/14612; H01L 27/14614; H01L 27/14616; H01L 27/14641; H01L 27/14656; H01L 27/14661; H01L 27/14663; H01L 27/14678; H10F 30/22; H10F 30/221; H10F 30/2218; H10F 30/222; H10F 30/225; H10F 39/193; H10F 39/196; H10F 39/80; H10F 39/803; H10F 39/807; H10F 39/103; H10F 39/802; H10F 39/8023; H10F 39/8027; H10F 39/8033; H10F 39/811; H10F 71/103; H10F 71/121; H10F 71/133
See application file for complete search history.

(56) References Cited

U.S. PATENT DOCUMENTS 10,672,934 B2 6/2020 Wang et al.
11,264,525 B2 3/2022 Wang et al.
(Continued)

FOREIGN PATENT DOCUMENTS

KR 20190049598 A 5/2019

*Primary Examiner* — Natalia A Gondarenko
(74) *Attorney, Agent, or Firm* — Andrew D. Fortney; Central California IP Group, P.C.

(57) ABSTRACT

Provided is a single-photon avalanche diode (SPAD) structure. More particularly, provided is a SPAD structure having an isolation structure for electrical and/or physical separation between a pixel area and a logic area.

9 Claims, 6 Drawing Sheets

(56) References Cited

U.S. PATENT DOCUMENTS

| | | | |
|---|---|---|---|
| 2009/0085078 A1* | 4/2009 | Lim | H01L 27/1463 257/292 |
| 2019/0131478 A1 | 5/2019 | Wang et al. | |
| 2019/0215472 A1* | 7/2019 | Lee | H04N 25/40 |
| 2020/0279969 A1 | 9/2020 | Wang et al. | |
| 2022/0140156 A1* | 5/2022 | Yagi | H01L 31/02363 356/5.01 |
| 2022/0254818 A1* | 8/2022 | Park | G01S 17/894 |
| 2024/0210529 A1* | 6/2024 | Matsumura | H01L 27/146 |

* cited by examiner

SPAD STRUCTURE

CROSS REFERENCE TO RELATED APPLICATION

The present application claims priority to Korean Patent Application No. 10-2021-0115550, filed Aug. 31, 2021, the entire contents of which is incorporated herein for all purposes by this reference.

BACKGROUND OF THE INVENTION

Field of the Invention

The present disclosure relates to a single-photon avalanche diode (SPAD) structure. More particularly, the present disclosure relates to a SPAD structure having an isolation structure for electrical and/or physical separation between a pixel area and a logic area.

Description of the Related Art

In general, single-photon avalanche diodes, which are referred to as SPADs, are used as photoelectric conversion devices in pixels of an imaging device. The SPADs have PN junctions to detect incident radiation, and may operate in Geiger mode, that is, a mode operating with a voltage much higher than a breakdown voltage, which is also referred to as an avalanche voltage, of a single-photon avalanche diode. Since a voltage exceeding the breakdown voltage is applied to a SPAD, an electron avalanche occurs due to carriers generated by photoelectric conversion, and the SPAD enters a breakdown state. As a result, carrier amplification caused by photoelectric conversion occurs, and the sensitivity in the imaging device may be improved.

FIG. 1 is a cross-sectional view showing a unit pixel in a general double (two)-ended SPAD structure. FIG. 2 is a cross-sectional view showing a unit pixel in a general single-ended SPAD structure.

Hereinafter, a general SPAD structure will be described with reference to FIGS. 1-2.

General SPAD structures may be classified into a single-ended SPAD type and a double-ended SPAD type. First, a unit pixel P1 of a double-ended SPAD structure 9 will be described with reference to FIG. 1. In a substrate 901 having a first conductivity type, an impurity region 910 having a second conductivity type is formed, and in the impurity region 910, an impurity region 920 having the first conductivity type is formed at the surface of the substrate 901. Therefore, an avalanche amplification region is formed at the PN junction of the interface between the impurity region 910 having the second conductivity type and the impurity region 920 having the first conductivity type.

In addition, the impurity region 920 having the first conductivity type is electrically connected to an anode 930, and the impurity region 910 having the second conductivity type is electrically connected to a cathode 940. As a voltage higher than a breakdown voltage is applied between the anode 930 and the cathode 940, the light absorbed into one side of the substrate 901 generates electrons through photoelectric conversion. The generated electrons move to the avalanche amplification region, thus causing avalanche amplification.

FIG. 3 is a graph showing absorption coefficients of silicon over a wavelength range.

Referring to FIG. 3, in general, a time-of-flight (ToF) sensor mainly uses a near-infrared (NIR) region with a long wavelength of 900 nm. The light in the NIR region has a low absorption coefficient in the substrate 901, and may reach the depths of the substrate 901 without being absorbed. Herein, in the double-ended SPAD structure 9, the PN junction is formed such that the region does not expand vertically (e.g., in the upward-downward direction), inevitably degrading sensitivity in the junction. That is, photon detection probability (PDP) inevitably decreases.

In addition, referring to FIG. 2, a unit pixel P1 in a general single-ended SPAD structure 9' includes a heavily doped impurity region 910' having a second conductivity type at the surface of a substrate 901' having a first conductivity type. The impurity region 910' is electrically connected to a cathode 930'. In addition, a heavily doped impurity region 920' having the first conductivity type surrounds the impurity region 910' is electrically connected to an anode 940'.

In this single-ended SPAD structure 9', a large depletion region 950' is formed along the PN junction under the impurity region 910' having the second conductivity type, which means that the depletion region 950' has a relatively large depth or vertical thickness and a relatively large width (e.g., along the left-right direction in FIG. 2). In addition, because negative-polarity voltages are at times applied to the anode 940' and the substrate 901', the pixel area P and a logic area (not shown) adjacent thereto should be electrically and/or physically separated. Therefore, a problem may occur in the electrical and/or physical isolation between adjacent unit pixels P1 and between the pixel area P and the adjacent logic area.

The foregoing is intended merely to aid in the understanding of the background of the present disclosure, and is not intended to mean that the present disclosure falls within the purview of the related art that is already known to those skilled in the art.

DOCUMENT OF RELATED ART

Korean Patent Application Publication No. 10-2019-0049598, "SPAD IMAGE SENSOR AND ASSOCIATED FABRICATING METHOD."

SUMMARY OF THE INVENTION

To solve the isolation problem between adjacent unit pixels P1 and between the pixel area P and the logic area in the single-ended SPAD structure 9', the present inventor conceived a new, improved SPAD structure.

The present disclosure is to solve the problems in the related art described above.

The present disclosure is directed to providing a SPAD structure including an isolation film at a boundary between adjacent unit pixels and spaced apart from a second surface of a substrate, thereby minimizing or avoiding additional difficulty in the manufacturing process and maintaining or maximizing the fill factor and the light receiving efficiency of the (unit) pixel.

In addition, the present disclosure is directed to providing a SPAD structure including a heavily doped impurity region having a second conductivity type under an isolation film, thereby achieving complete or substantially complete electrical isolation between adjacent unit pixels, or between a pixel (e.g., the unit pixel) and a logic area (e.g., the adjacent logic area).

In addition, the present disclosure is directed to providing a SPAD structure including an impurity region having a first conductivity type under an isolation film and connected to an anode, thereby simplifying a single-ended SPAD structure.

In addition, the present disclosure is directed to providing a SPAD structure including an impurity region having a first conductivity type connected to an anode and an impurity region having a second conductivity type connected to a cathode at opposite surfaces, thereby reducing lateral components in the electric field and thus improving PDP.

In addition, the present disclosure is directed to providing a SPAD structure including a first isolation region between adjacent unit pixels that does not reach a second surface of a substrate and a second isolation region at a boundary between a pixel area (e.g., of one of the unit pixels) and a logic area (e.g., an adjacent logic area) that extends to the second surface, thereby minimizing any decrease in light receiving efficiency and achieving electrical isolation between the logic area and the pixel area.

The present disclosure may be implemented by one or more of the following embodiments, configured to achieve one or more of the above-described objectives.

An embodiment the present disclosure provides a SPAD structure including a unit pixel including a substrate having a first conductivity type and a first surface and a second surface facing each other; a first impurity region having a second conductivity type at the second surface of the substrate; a second impurity region having the first conductivity type at the second surface of the substrate, the second impurity region surrounding the first impurity region; a cathode connected to the impurity region having the second conductivity type; an anode connected to the second impurity region; and an isolation film extending from the first surface, wherein the isolation film is at a boundary of the unit pixel. For example, the SPAD structure may include a plurality of the unit pixels, and the isolation film may be at a boundary or interface between adjacent ones of the unit pixels.

According to another embodiment of the present disclosure, in the SPAD structure, the isolation film may be spaced apart from the second surface (e.g., vertically, or in an upward-downward direction).

According to still another embodiment of the present disclosure, in the SPAD structure, the isolation film may comprise a deep trench isolation (DTI) structure.

According to still another embodiment of the present disclosure, in the SPAD structure, the unit pixel may further include an isolation region comprising a third impurity doped region having the second conductivity type, extending from the isolation film (e.g., a nearest surface thereof) to the second surface.

According to still another embodiment of the present disclosure, in the SPAD structure, the second impurity region may be configured to receive a negative-polarity voltage, and the isolation region may be connected to a ground potential or be configured to receive a positive-polarity voltage.

According to still another embodiment of the present disclosure, there is provided a SPAD structure including a unit pixel including a substrate having a first conductivity type and a first surface and a second surface facing each other; a first impurity region having a second conductivity type at the second surface of the substrate; a second impurity region having a first conductivity type at the second surface of the substrate, the second impurity region surrounding the first impurity region; a cathode connected to the first impurity region; an anode connected to the second impurity region; and an isolation film extending from the first surface, wherein the second impurity region is under the isolation film.

According to still another embodiment of the present disclosure, in the SPAD structure, the isolation film may not laterally overlap the first impurity region.

According to still another embodiment of the present disclosure, in the SPAD structure, the second impurity region may comprise a heavily doped impurity region, configured to receive a negative-polarity voltage.

According to still another embodiment of the present disclosure, in the SPAD structure, the isolation film and the second impurity region may be at a boundary of the unit pixels. For example, the SPAD structure may include a plurality of the unit pixels, and the isolation film and the second impurity region may be at a boundary or interface between adjacent ones of the unit pixels.

According to still another embodiment of the present disclosure, in the SPAD structure, the second impurity region may be spaced apart from the first impurity region.

According to still another embodiment of the present disclosure, there is provided a SPAD structure including a unit pixel including a substrate having a first conductivity type and a first surface and a second surface facing each other; a first impurity region having a second conductivity type at the second surface of the substrate; a second impurity region at the second surface of the substrate, the second impurity region surrounding the first impurity region and having the first conductivity type; a third impurity region having the first conductivity type in the substrate; a cathode connected to the first impurity region; an anode connected to the third impurity region; and an isolation film extending from the first surface.

According to still another embodiment of the present disclosure, in the SPAD structure, the third impurity region may be at the first surface of the substrate.

According to still another embodiment of the present disclosure, in the SPAD structure, the third impurity region may at least partially overlap the first impurity region vertically.

According to still another embodiment of the present disclosure, in the SPAD structure, the second impurity region may be between the isolation film and the second surface of the substrate.

According to still another embodiment of the present disclosure, there is provided a SPAD structure including a pixel area including a plurality of unit pixels in a substrate having a first conductivity type and a first surface and a second surface facing each other, each unit pixel including a first impurity region having a second conductivity type at the second surface of the substrate, a second impurity region having the first conductivity type at the second surface of the substrate, the second impurity region surrounding the first impurity region, and a first isolation film extending from the first surface and being spaced apart from the second surface; a logic area surrounding the plurality of unit pixels; and a second isolation film at or adjacent to a boundary between the logic area and the pixel area.

According to still another embodiment of the present disclosure, in the SPAD structure, the second isolation film may extend from the first surface of the substrate to the second surface thereof.

According to still another embodiment of the present disclosure, in the SPAD structure, the second isolation film may have a greater diameter or width than the first isolation film.

According to still another embodiment of the present disclosure, in the SPAD structure, each of the unit pixels may further include a cathode connected to the first impurity region; and an anode connected to the second impurity region.

According to still another embodiment of the present disclosure, in the SPAD structure, each of the unit pixels may further include an additional impurity region having the first conductivity type at the first surface of the substrate; an anode connected to the additional impurity region; and a cathode connected to the first impurity region, wherein at least half of the second isolation film may be in the logic area.

According to the above configurations, the present disclosure has the following effects.

According to the present disclosure, the isolation film is at a boundary between adjacent unit pixels and is spaced apart from the second surface of the substrate, thereby minimizing or avoiding additional difficulty in the manufacturing process and maintaining or maximizing the fill factor and the light receiving efficiency of the (unit) pixel.

In addition, according to the present disclosure, a heavily doped impurity region having the second conductivity type is under the isolation film, thereby achieving complete or substantially complete electrical isolation between adjacent unit pixels or between a pixel area and a logic area.

In addition, according to the present disclosure, the impurity region having the first conductivity type is connected to the anode and is under the isolation film, thereby simplifying a single-ended SPAD structure.

In addition, according to the present disclosure, the impurity region having the first conductivity type connected to the anode and the first impurity region connected to the cathode are at opposite surfaces (e.g., of the substrate), thereby reducing lateral components in the electric field and thus improving PDP.

In addition, according to the present disclosure, the first isolation region between adjacent unit pixels does not reach the second surface of the substrate, and the second isolation region at or adjacent to a boundary between a pixel area and a logic area extends to the second surface, thereby minimizing any decrease in light receiving efficiency and achieving electrical isolation between the logic area and the pixel area.

It is noted that, although not explicitly described herein, an advantageous effect and a tentative advantageous effect that are expected from technical features of the present disclosure are regarded as being described in the present specification.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
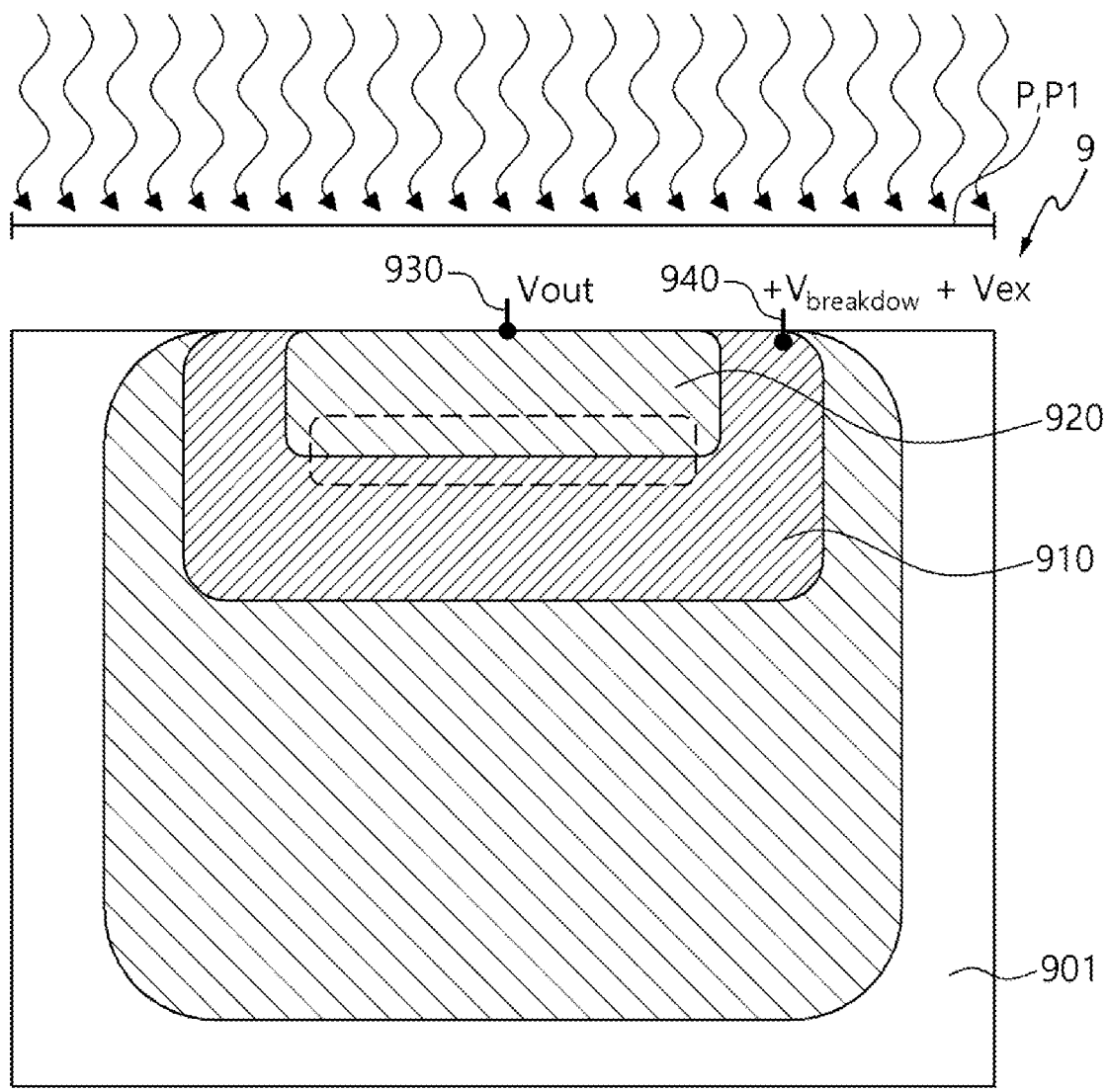
FIG. 1 is a cross-sectional view showing a unit pixel in a general double (two)-ended SPAD structure.
Figure 2:
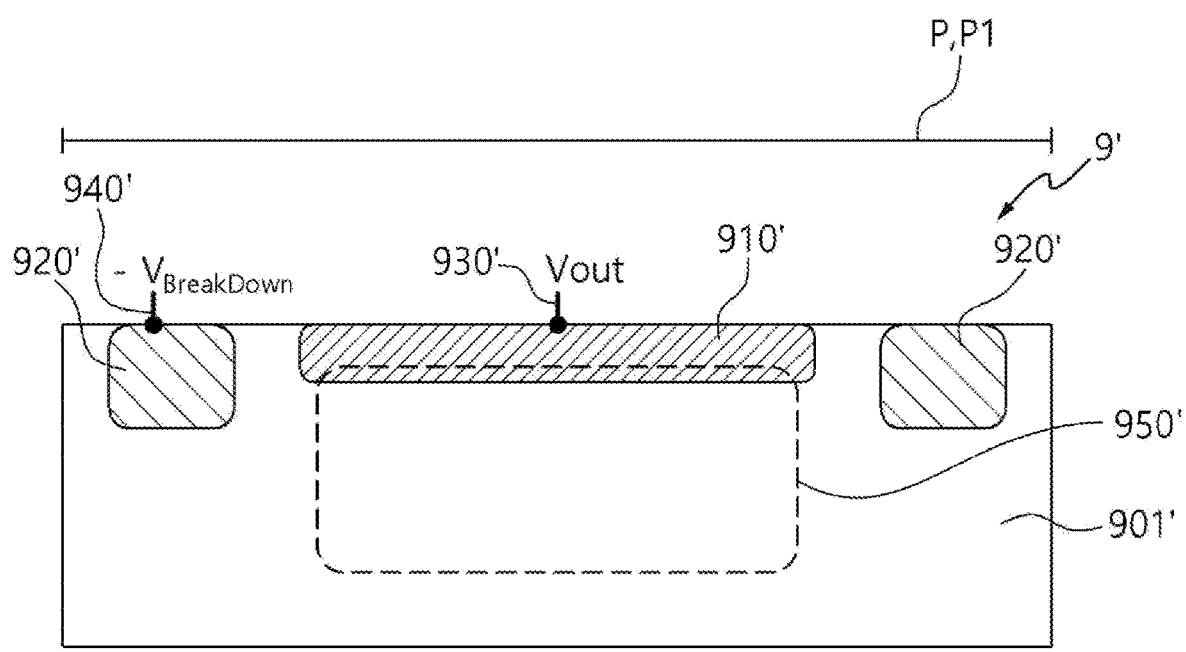
FIG. 2 is a cross-sectional view showing a unit pixel in a general single-ended SPAD structure.
Figure 3:
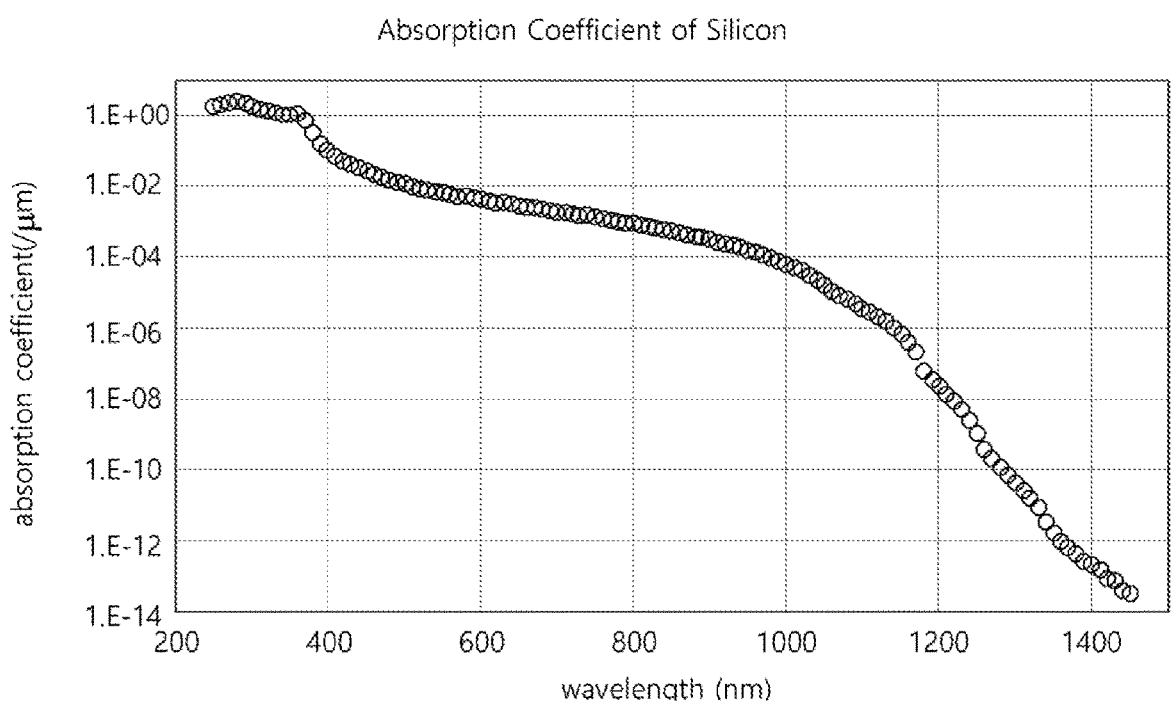
FIG. 3 is a graph showing absorption coefficients of silicon over a wavelength range.

Hereinafter, embodiments of the present disclosure will be described in detail with reference to the accompanying drawings. It is noted that embodiments of the present disclosure may be changed to a variety of embodiments. The scope of the present disclosure should not be interpreted as being limited to the embodiments described hereinbelow, but should be interpreted on the basis of the descriptions in the appended claims. In addition, the embodiments of the present disclosure are provided for reference in order to fully describe the disclosure for those skilled in the art.

Unless otherwise mentioned in context, a singular noun or a singular noun phrase may have a plural meaning through the present specification. The terms "comprise" and/or "comprising" that are used in the present specification are intended to indicate that a shape, a number, a step, an operation, a member, an element, a group thereof, etc., are present, and do not preclude the presence or addition of one or more other shapes, numbers, steps, operations, members, elements, groups thereof, etc.

It should be noted that, in a case where one element (or layer) is described as being on (or on top of) another element (or layer), this means that the one element may be directly on the other element or that one or more third elements or layers may be therebetween. In addition, in the case where one element is described as being directly on another element, no third element is therebetween. In addition, one element being on a "top," "upper portion," "lower portion," "above," "below," or on "one lateral side" or "lateral surface" of another element means a relative positional relationship between the two elements.

In addition, the terms first, second, third, and so on may be used in order to describe various and/or multiple items, such as elements, regions, and/or portions, but do not impose any limitation to these items.

In addition, it should be noted that, where certain embodiments are otherwise feasible, certain process sequences may be performed other than those described below. For example, two processes described in succession may be performed substantially simultaneously or in the reverse order.

In addition, conductivity types or doped areas may be defined as "p-type" or "n-type" according to main carrier characteristics, but this is only for convenience of description, and the technical idea of the present disclosure is not limited thereto. For example, hereinafter, "p-type" or "n-type" may be replaced with the more general terms "first conductivity type" or "second conductivity type". Herein, "first conductivity type" may refer to p-type, and "second conductivity type" may refer to n-type.

In addition, it is to be understood that the terms "heavily" and "lightly," referring to a doping concentration in an impurity region, refer to a relative doping concentration of one element or region relative to another element or region.

In the present specification, according to need, individual elements may be integral with each other or independent of each other. It should be noted that no specific limitation to these formations is imposed.

Hereinafter, a SPAD structure 1 according to a first exemplary embodiment of the present disclosure will be described in detail with reference to the accompanying drawings.

The present disclosure relates to a single-photon avalanche diode (SPAD) structure 1. More particularly, the present disclosure relates to a SPAD structure having an isolation structure for electrical and/or physical separation between a pixel area P and a logic area. The isolation structure may be between adjacent ones of a plurality of unit pixels P1 in a pixel area P, or between a pixel area P and a logic area. This will be described in detail later.

In addition, the present disclosure may be applied to a single-ended SPAD structure, rather than a double (two)-ended SPAD structure.

Figure 4:
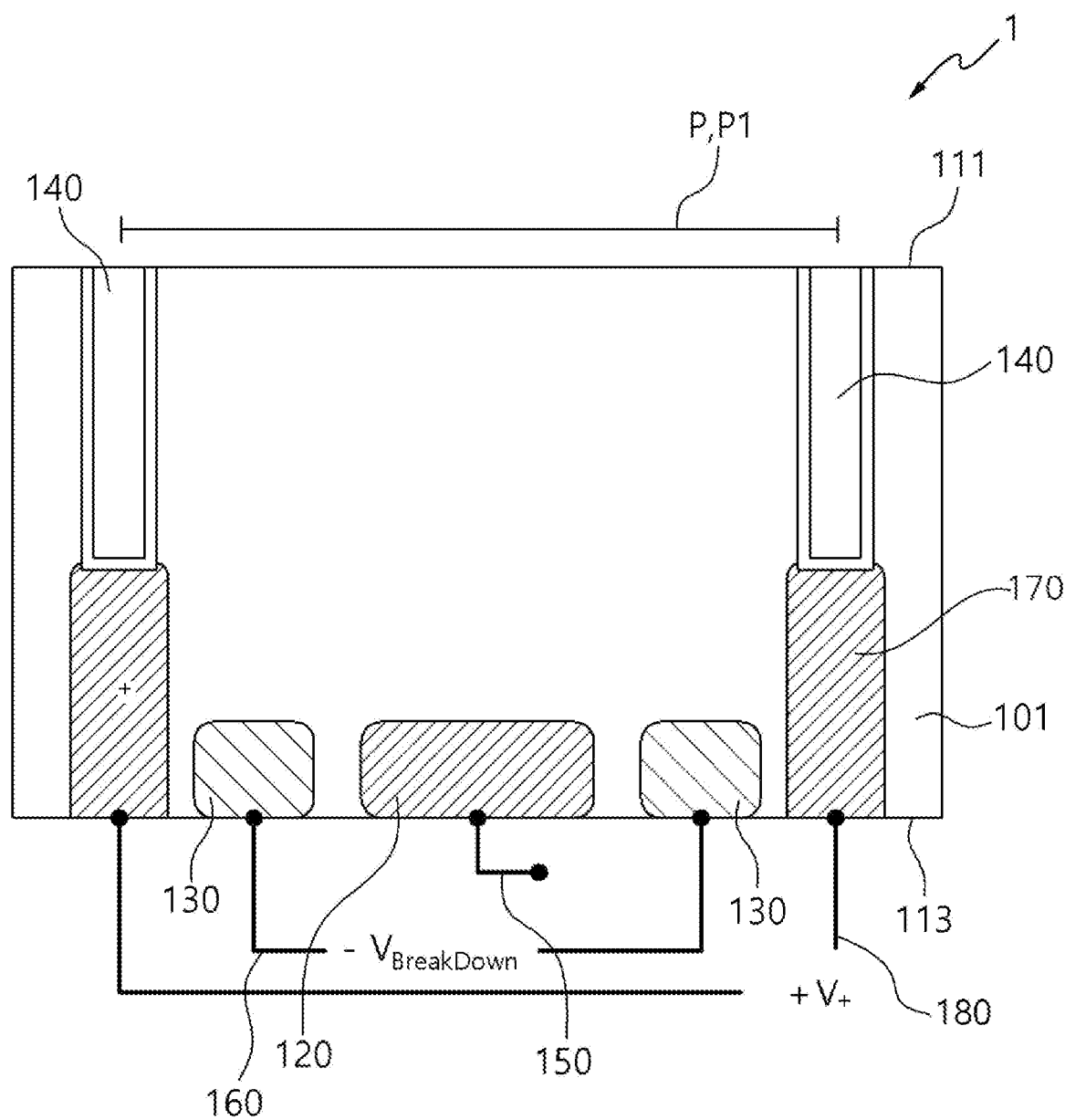
FIG. 4 is a cross-sectional view showing a unit pixel in a SPAD structure according to a first exemplary embodiment of the present disclosure.

FIG. 4 is a cross-sectional view showing a unit pixel in a SPAD structure according to a first exemplary embodiment of the present disclosure.

Referring to FIG. 4, a unit pixel P1 of the SPAD structure 1 according to the first exemplary embodiment of the present disclosure will be described. A substrate 101 has a first surface 111 and a second surface 113. The first surface 111 and the second surface 113 are opposite surfaces. The first surface 111 may be a rear surface, and the second surface 113 may be a front surface. The substrate 101 may be a lightly doped with impurities having a first conductivity type. In addition, at the second surface 113 of the substrate 101 is a first impurity region 120 having a second conductivity type. The region 120 may be heavily doped with second conductivity type impurities. In addition, a second impurity region 130 having the first conductivity type may surround a lateral part or sidewall of the first impurity region 120. The second impurity region 130 may have a ring or disk-like shape, for example, when viewed in a plan or layout view.

At a boundary of each individual unit pixel P1 or at the first surface 111 adjacent to the boundary, an isolation film 140 may extend vertically. The isolation film 140 may comprise a deep trench isolation (DTI) structure. For example, after a deep trench is formed through a deep reactive ion etching (DRIE) process, an oxide liner is conventionally formed on a lateral surface or sidewall of the trench, and the trench is filled with undoped polysilicon (e.g., by blanket conformational or directional deposition), thereby forming the isolation film 140. However, no limitation thereto is imposed.

In addition, it is preferable that the isolation film 140 extends from the first surface 111 of the substrate 101 and has a length or depth that does not reach the second surface 113 of the substrate 101.

The surest way for electrical/physical separation between unit pixels P1 is for the isolation film 140 to extend from the first surface 111 to the second surface 113 of the substrate 101. However, forming a deep isolation film 140 at the boundary between adjacent unit pixels P1 in a small area increases the process difficulty and also decreases the fill factor the light receiving efficiency of the pixels P1.

Therefore, the isolation film 140 according to the first exemplary embodiment of the present disclosure does not reach the second surface 113. For example, the isolation film 140 may not horizontally overlap the first impurity region 120, but is not limited thereto.

In addition, the first impurity region 120 may be electrically connected to a cathode 150 at the second surface 113 of the substrate 101. The second impurity region 130 may be electrically connected to an anode 160 at the second surface 113 of the substrate 101.

According to the first exemplary embodiment of the present disclosure, an additional/third isolation region 170 may be included, extending from the isolation film 140 to the second surface 113 of the substrate 101 (or vice versa). The isolation region 170 may be a heavily doped impurity region having the second conductivity type, for example. In addition, the isolation region 170 may be connected to an electrode 180, and a positive-polarity voltage may be applied to the isolation region 170 (e.g., through the electrode 180). Alternatively, for example, the isolation region 170 may be connected to a ground (GND) potential, and/or a positive-polarity voltage may be applied to the isolation region 170. No limitation thereto is imposed.

For example, assuming the case (reverse bias) in which a positive-polarity voltage is applied to the isolation region 170 and a negative-polarity voltage is applied to the second impurity region 130, the area of the depletion region increases at the substrate 101 adjacent to the isolation region 170 in the lateral direction and the potential barrier thus increases, thereby achieving electrical separation between adjacent unit pixels P1. The isolation region 170 may be formed by an ion implantation process, but is not limited thereto.

The first and second impurity regions 120 and 130 may also be formed, for example, by ion implantation into the second or front surface 113 of the substrate 101, similar to the isolation region 170, but generally at a lower energy. Typically, this ion implantation is conducted when the substrate 101 includes a sacrificial portion (not shown) or is bonded to a sacrificial substrate (also not shown) at the first or rear surface 111. After formation of the first and second impurity regions 120 and 130 and the isolation region 170, the sacrificial substrate or sacrificial portion is removed (e.g., by conventional hydrogen implantation and cleaving). Cleaving may occur after formation of the electrodes 150, 160 and 180 and one or more surrounding and/or overlying dielectric materials and/or passivation layers. The isolation film 140 may be formed after the front surface 113 of the substrate 101 is mechanically supported (e.g., by the dielectric material[s] and/or passivation layer[s], or a separate sacrificial substrate [not shown]). If a separate sacrificial substrate is used to mechanically support the substrate 101 during formation of the isolation film 140, the separate sacrificial substrate is conventionally removed after the isolation film 140 is formed. The electrodes 150, 160 and 180 may be formed after removal of the separate sacrificial substrate.

Figure 5:
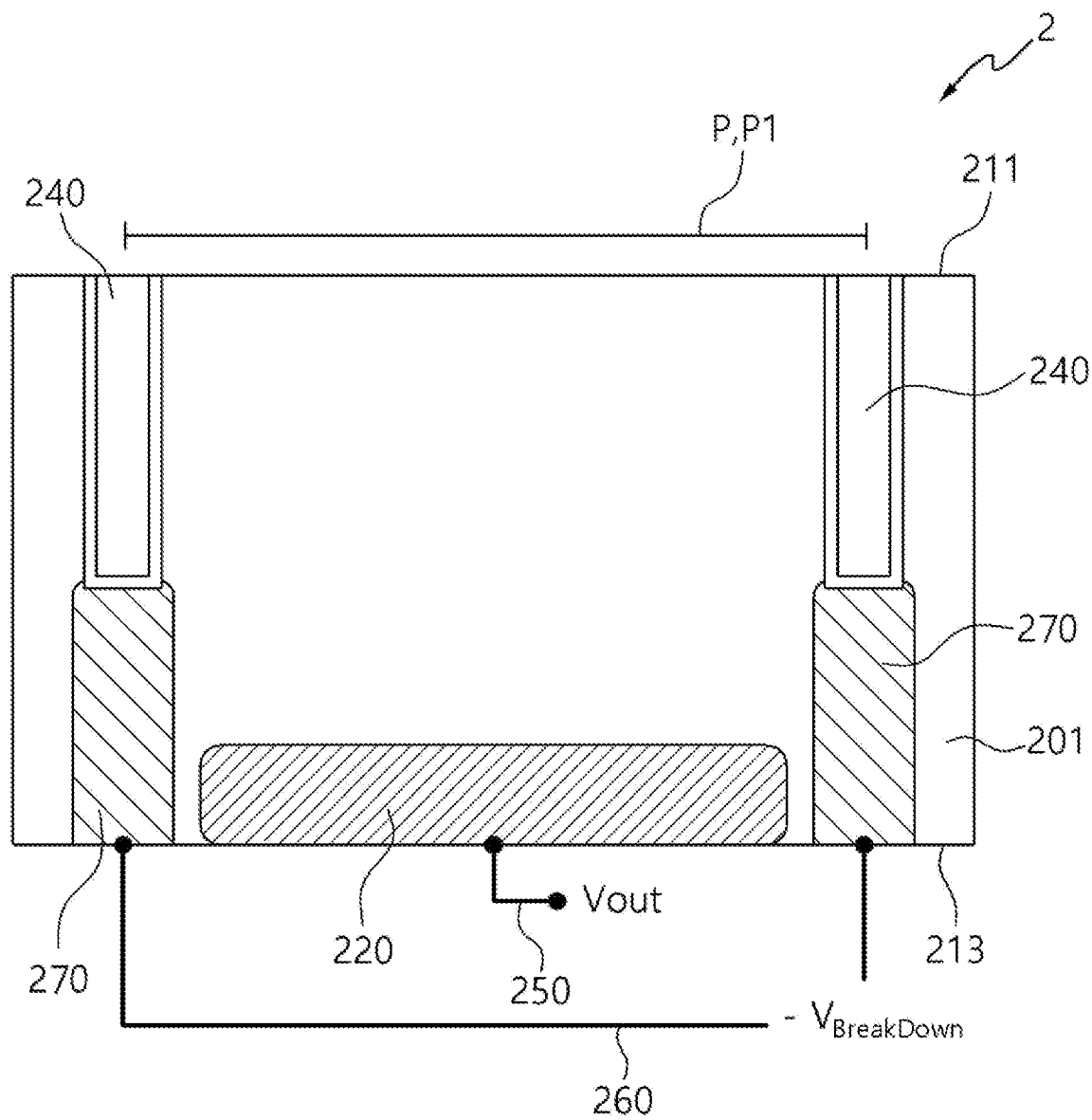
FIG. 5 is a cross-sectional view showing a unit pixel in a SPAD structure according to a second exemplary embodiment of the present disclosure.

FIG. 5 is a cross-sectional view showing a unit pixel P1 in a SPAD structure 2 according to a second exemplary embodiment of the present disclosure.

Hereinafter, the SPAD structure 2 according to the second exemplary embodiment of the present disclosure will be described in detail with reference to the accompanying drawings. Before describing the SPAD structure 2 according to the second exemplary embodiment, the elements of the SPAD structure 2 the same as those of the SPAD structure 1 according to the first exemplary embodiment will not be described in detail.

First, referring to FIG. 5, a substrate 201 has a first conductivity type has a first surface 211 and a second surface 213. The substrate 201 includes a first impurity region 220 having a second conductivity type at the second surface 213. The first impurity region 220 may be heavily doped. In addition, a second impurity region 270 having the first conductivity type may surround a lateral part or sidewall of the first impurity region 220 and may be at the second surface 213 of the substrate 201. The second impurity region 270 may have a ring or disk-like shape, for example. In addition, the isolation film 240 extends a predetermined distance from the first surface 211 of the substrate 201, and is preferably the same as the isolation film 140 according to the first exemplary embodiment.

In addition, the first impurity region 220 may be electrically connected to a cathode 250 at the second surface 213 of the substrate 201. The second impurity region 270 may be electrically connected to an anode 260 at the second surface 213 of the substrate 201. In this structure, the second impurity region 270 may extend from the isolation film 240 to the second surface 213 of the substrate 201. That is, the second impurity region 270 may be at substantially the same position as the isolation region 170 of the first exemplary embodiment. Compared to the structure 1 according to the first exemplary embodiment, this structure 2 does not require one of the second impurity region 130 and the isolation region 170, thereby simplifying the manufacturing process and potentially increasing the fill factor and/or the light-receiving efficiency of the unit pixel P1. The structure 2 can be made by a process similar to that of the structure 1 in FIG. 4, except that there is no need to make one of the second impurity region 130 and the isolation region 170, or the corresponding electrode.

Figure 6:
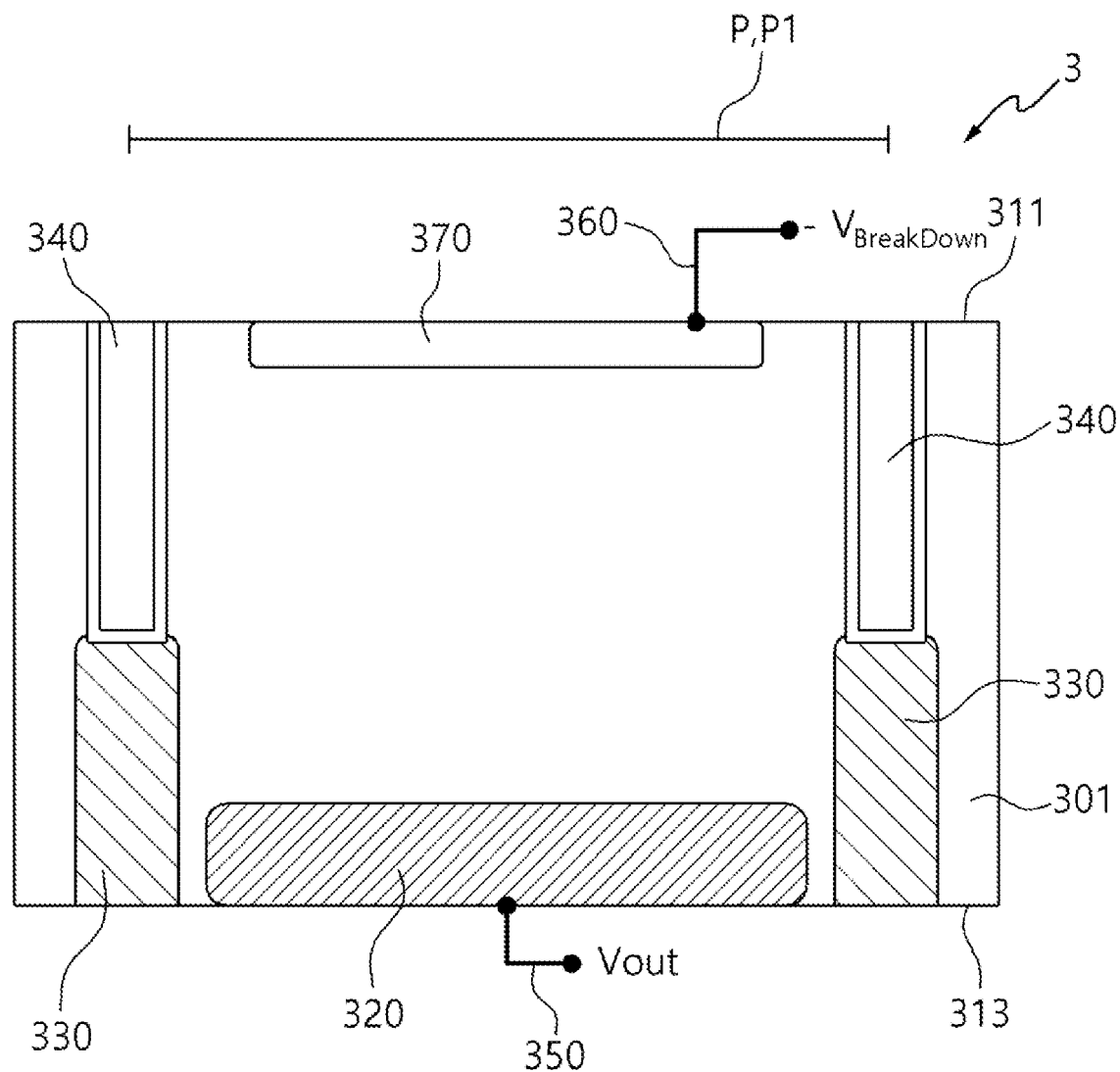
FIG. 6 is a cross-sectional view showing a unit pixel in a SPAD structure according to a third exemplary embodiment of the present disclosure.

FIG. 6 is a cross-sectional view showing a unit pixel P1 in a SPAD structure 3 according to a third exemplary embodiment of the present disclosure.

Hereinafter, the SPAD structure 3 according to the third exemplary embodiment of the present disclosure will be described in detail with reference to the accompanying drawings. Before describing the SPAD structure 3 according to the third exemplary embodiment, the elements of the SPAD structure 3 the same as those of the SPAD structures 1 and 2 according to the first and second exemplary embodiments will not be described in detail.

Referring to FIG. 6, a substrate 301 having a first conductivity type has a first surface 311 and a second surface 313. In the substrate 301 having the first conductivity type, a first impurity region 320 having a second conductivity type is at the second surface 313. The region 320 may be heavily doped. In addition, a second impurity region 330 may be at the second surface 313 of the substrate 301, surrounding a lateral part or sidewall of the first impurity region 320. The second impurity region 330 may be heavily doped. The second impurity region 330 may have a ring or disk-like shape, for example. In addition, the isolation film 340 extends a predetermined distance from the first surface 311 of the substrate 301, and is preferably the same as the isolation film 140 according to the first exemplary embodiment. The second impurity region 330 may be at substantially the same position as the second impurity region 270 according to the second exemplary embodiment.

In addition, the first impurity region 320 is connected to a cathode 350 at the second surface 313 of the substrate 301. The second impurity region 330 is not electrically connected to an anode 360 at the second surface 313 of the substrate 301. However, a third impurity region 370 may be at the first surface 311 of the substrate 301. The third impurity region 370 may be heavily doped with impurities having the first conductivity type.

In addition, the third impurity region 370 is electrically connected to the anode 360. That is, compared to the second exemplary embodiment, the anode 360 and the cathode 350 are electrically connected to structures on opposite surfaces of the substrate 301. In other words, the third impurity region 370 is on the first surface 311, and the first impurity region 320 is on the second surface 313, so that the third impurity region 370 and the impurity region 320 are vertically spaced apart from each other. The third impurity region 370 may be formed by ion implantation into the second surface 313 of the substrate, generally immediately before or immediately after formation of the isolation film 340. Otherwise, the process for making the SPAD structure 3 is substantially the same as that for making the SPAD structure 2.

Compared to the structure 2 according to the second exemplary embodiment, the structure 3 reduces a number of lateral components in the electric field, thereby improving PDP.

Figure 7:
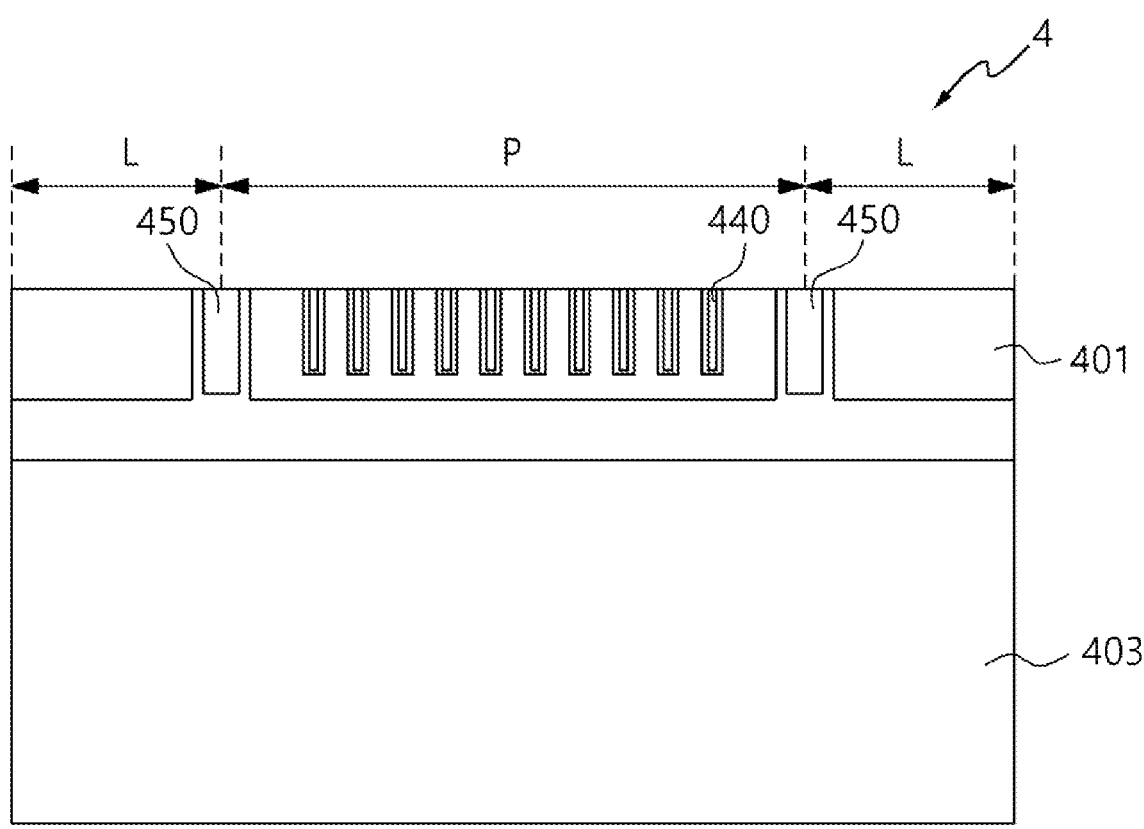
FIG. 7 is a cross-sectional view showing a SPAD structure according to a fourth exemplary embodiment of the present disclosure.

FIG. 7 is a cross-sectional view showing a SPAD structure 4 according to a fourth exemplary embodiment of the present disclosure.

Hereinafter, the SPAD structure 4 according to the fourth exemplary embodiment including a plurality of unit pixels according to the first, second and/or third exemplary embodiments of the present disclosure in a pixel area P will be described in detail with reference to the accompanying drawings.

First, referring to FIGS. 5 and 6, the structures 1, 2 and 3 according to the first, second and third exemplary embodiments of the present disclosure have the isolation films 140, 240 and 340 having a deep trench isolation (DTI) structure. As described above, the isolation films 140, 240 and 340 extend from the first surfaces 111, 211 and 311 of the substrates 101, 201 and 301, but do not reach the second surfaces 113, 213 and 313. Herein, since the heavily doped impurity regions 170, 270 and 330 having the first conductivity type are coplanar with the isolation films 140, 240 and 340, the isolation films 140, 240 and 340 do not completely electrically and/or physically separate the pixel area P from the logic area L adjacent thereto (see FIG. 7). Accordingly, when a negative-polarity voltage is applied to the anodes 160, 260 and 360, a negative-polarity voltage may also be applied to the logic area L (e.g., the substrate in the logic area L).

To solve this problem, in the SPAD structure 4 according to the fourth exemplary embodiment of the present disclosure as shown in FIG. 7, a first isolation film 440 the same as the isolation film 140, 240 or 340 according to the first through third exemplary embodiments at boundaries between individual unit pixels in the pixel area P, and a second isolation film 450 at or adjacent to a boundary or interface between the logic area L and the pixel area P extends from the first surface 111, 211 or 311 of the substrate 101, 201 or 301 (FIGS. 4-6) to the second surface 113, 213 or 313 thereof, thereby achieving complete electrical/physical separation between the logic area L and the pixel area P.

As described above, the second isolation film 450 may have a DTI structure at or adjacent to a boundary between a logic area L and a pixel area P and completely penetrating through the substrate 401 (which is identical to the substrate 101, 201 and 301 in FIGS. 4-6), thereby possibly reducing the effect on the fill factor and potentially minimizing the decrease in light receiving efficiency (e.g., by the unit pixels in the pixel area). About half or more of the area or volume of the second isolation film 450 may be in the logic area L (e.g., the entire second isolation film 450 may be in the logic area L). No limitation thereto is imposed. In addition, it is preferable that the second isolation film 450 has a greater diameter or width than the first isolation film 440. It is also preferable that the second isolation film 450 has a greater depth than the first isolation film 440.

The substrate 401 may be temporarily bonded to a carrier wafer or other sacrificial substrate 403 (e.g., by conventional wafer bonding) to prevent the substrate 401 from being cracked or damaged.

The foregoing detailed description illustrates the present disclosure. In addition, the foregoing illustrates and describes various embodiments of the present disclosure, and the present disclosure may be utilized in various other combinations, modifications and environments. That is, it is possible to make changes or modifications within the scope of the concept of the disclosure disclosed herein, within the scope of equivalents to the above described disclosure, and/or within the scope of the skill or knowledge of the art. The above-described embodiments are intended to describe the best mode for carrying out the technical spirit of the present disclosure, and various modifications for the specific applications and uses of the present disclosure are possible. Accordingly, the foregoing detailed description is not intended to limit the present disclosure to the embodiments disclosed.

What is claimed is:

1. A single-photon avalanche diode (SPAD) structure, comprising a unit pixel comprising:
    a substrate having a first conductivity type and a first surface and a second surface facing each other;
    a first impurity region having a second conductivity type at the second surface of the substrate;
    a second impurity region having a first conductivity type at the second surface of the substrate, the second impurity region surrounding the first impurity region;
    a cathode connected to the first impurity region;
    an anode connected to the second impurity region; and
    an isolation film extending from the first surface and being spaced apart from the second surface of the substrate,
    wherein the second impurity region is under the isolation film, and
    a lowermost surface of the isolation film is in contact with an uppermost surface of the second impurity region.

2. The SPAD structure of claim 1, wherein the isolation film does not laterally overlap the first impurity region.

3. The SPAD structure of claim 1, wherein the second impurity region comprises a heavily doped impurity region, configured to receive a negative-polarity voltage.

4. The SPAD structure of claim 1, wherein the isolation film and the second impurity region are at a boundary of the unit pixel.

5. The SPAD structure of claim 1, wherein the second impurity region is spaced apart from the first impurity region.

6. A single-photon avalanche diode (SPAD) structure, comprising:
    a pixel area comprising a plurality of unit pixels in a substrate having a first conductivity type and a first surface and a second surface facing each other, each unit pixel comprising a first impurity region having a second conductivity type at the second surface of the substrate; a second impurity region having the first conductivity type at the second surface of the substrate, the second impurity region surrounding the first impurity region; a first isolation film extending from the first surface and being spaced apart from the second surface, a cathode connected to the first impurity region; and an anode connected to the second impurity region;
    a logic area surrounding the plurality of unit pixels; and
    a second isolation film at or adjacent to a boundary between the logic area and the pixel area, wherein:
        the second impurity region is under the first isolation film, and
        a lowermost surface of the first isolation film is in contact with an uppermost surface of the second impurity region.

7. The SPAD structure of claim 6, wherein the second isolation film extends from the first surface of the substrate to the second surface thereof.

8. The SPAD structure of claim 7, wherein the second isolation film has a greater diameter or width than the first isolation film.

9. The SPAD structure of claim 7, wherein each of the unit pixels further comprises:
    an additional impurity region having the first conductivity type at the first surface of the substrate;
    an anode connected to the additional impurity region; and
    a cathode connected to the first impurity region,
    wherein at least half of the second isolation film is in the logic area.

* * * * *